United States Patent [19]

Nozaki et al.

[11] Patent Number: 4,570,088
[45] Date of Patent: Feb. 11, 1986

[54] SEMICONDUCTOR DEVICE FOR PULLING DOWN OUTPUT TERMINAL VOLTAGE

[75] Inventors: Shigeki Nozaki; Tomio Nakano, both of Kawasaki; Katsuhiko Kabashima, Mizusawa, all of Japan

[73] Assignee: Fujitsu Limited, Kawasaki, Japan

[21] Appl. No.: 510,183

[22] Filed: Jul. 1, 1983

[30] Foreign Application Priority Data

Jul. 1, 1982 [JP] Japan .................. 57-114244

[51] Int. Cl.[4] .......................................... H03K 19/096
[52] U.S. Cl. .................................. 307/481; 307/443; 307/482; 307/269; 307/605
[58] Field of Search ............... 307/200 A, 443, 453, 307/481, 482, 572, 574, 575, 577, 578, 581–583, 269, 594, 601, 605, 200 B

[56] References Cited

U.S. PATENT DOCUMENTS

| | | | |
|---|---|---|---|
| 4,061,933 | 12/1977 | Schroeder et al. | 307/481 X |
| 4,097,772 | 6/1978 | Carter | 307/574 X |
| 4,291,242 | 9/1981 | Schriber | 307/481 X |
| 4,296,340 | 10/1981 | Horan | 307/594 X |
| 4,379,974 | 4/1983 | Plachno | 307/578 X |
| 4,409,678 | 10/1983 | Takemae et al. | 307/572 X |
| 4,447,745 | 5/1984 | Takemae et al. | 307/578 X |
| 4,468,576 | 8/1984 | Takemae | 307/453 X |

Primary Examiner—Stanley D. Miller
Assistant Examiner—D. R. Hudspeth
Attorney, Agent, or Firm—Staas & Halsey

[57] ABSTRACT

A semiconductor device, provided with a buffer, which comprises a first transistor for pulling up the output terminal voltage, a second transistor for pulling down the output terminal voltage, and a charge-pumping circuit for maintaining the output terminal voltage at a level higher than the power source voltage by charge pumping when the output terminal voltage is at a high level. The semiconductor device further comprises a circuit for pulling down the output terminal voltage during the period from when power is supplied to when an input signal is supplied to the buffer.

6 Claims, 9 Drawing Figures

SEMICONDUCTOR DEVICE FOR PULLING DOWN OUTPUT TERMINAL VOLTAGE

BACKGROUND OF THE INVENTION (1) Field of the Invention

The present invention relates to a semiconductor device and more particularly to an output circuit thereof.

(2) Description of the Prior Art

In a semiconductor dynamic memory, various clocks having predetermined timing relationships are used to activate respective parts of the memory. Furthermore, the power source voltage has been reduced from 12 V to a level of 5 V and, thus, the element size is reduced. Accordingly, the accumulated charge in the memory cell is very small. In a device where the size and the voltage of the power source are thus reduced, it is desired to increase the quantity of the charge stored in cells and cause the cells to operate sufficiently and stably by increasing the clock amplitudes beyond the power source voltage. For attaining this purpose, a bootstrap circuit and a charge-pumping circuit have been used.

However, an output-level guaranteeing circuit utilizing a charge-pumping circuit has a problem at the time of application of power. A clock pulse of the charge-pumping circuit is usually output from a substrate bias-voltage generating circuit, and the substrate bias-voltage generating circuit starts operating substantially simultaneously with the application of the power source voltage so that the clock pulse is simultaneously produced. However, clock pulses for activating a buffer circuit connected before the output circuit, are output from predetermined stages of the various clock pulse generators connected in multiple stages. Therefore, the predetermined logic levels of the clock pulse are not attained at the time of application of the power source voltage. When these clock pulses for activating the buffer circuit are all at a low level, the output is in the floating state.

When the clock pulse of the charge-pumping circuit becomes a high level with the rising of the power source voltage, the output voltage level rises for a reason which explained in detail later. If the output voltage level rises in such a manner, sometimes an abnormal current flows, and short circuiting of the power source may occur.

SUMMARY OF THE INVENTION

An object of the present invention is to obviate the above disadvantages and prevent erroneous operation at a time of application of the power source voltage.

According to the present invention, the abovementioned object can be achieved by providing a semiconductor device provided with a buffer, which and comprises a first transistor for pulling up the output terminal voltage, a second transistor for pulling down the output terminal voltage, and a charge-pumping circuit for maintaining the output terminal voltage at a level higher than the power source voltage by charge pumping when the output terminal voltage is at a high level. The semiconductor device further comprises a circuit for pulling down the output terminal voltage during the time period from when power is supplied to when an input signal is supplied to the buffer.

Further features and advantages of the present invention will be apparent from the ensuing description, with reference to the accompanying drawings, to which, however, the scope of the invention is in no way limited.

DESCRIPTION OF THE PREFERRED EMBODIMENTS

Figure 1:
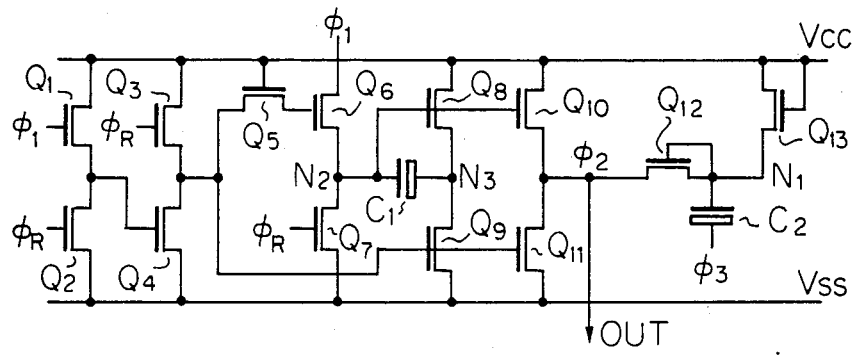
FIG. 1 is a circuit diagram of a conventional buffer having an output connected to a charge-pumping circuit.
Figure 2A:
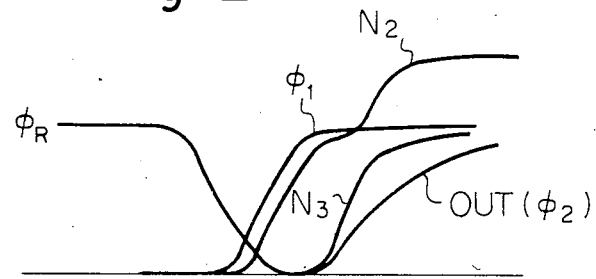
FIGS. 2A and 2B are timing charts of the operation of the circuit shown in FIG. 1.

FIG. 1 is a circuit for generating a second clock pulse $\phi_2$ which rises upon receipt of a first clock pulse $\phi_1$ and drops upon receipt of a reset clock pulse $\phi_R$. In FIG. 1, Q1 through Q13 represent metaloxide semiconductor (MOS) transistors, C1 and C2 represent capacitors, Vcc and Vss represent H (high) and L (low) levels of a 5 V power source, and OUT represents an output. When the clock pulse $\phi_R$ is input to this circuit, the transistors Q2 and Q3 are turned on, the transistor Q4 is turned off, the transistors Q9 and Q11 are turned on, the transistor Q7 is turned on, the transistors Q8 and Q10 are turned off, and the voltage $\phi_2$ of the output is maintained at a low level L. The gate of the transistor Q6 is charged at a high level H through the gate Q5. When the clock pulse $\phi_1$ rises and the clock pulse $\phi_R$ drops as shown in FIG. 2A, the transistor Q1 is turned on, the transistors Q2, Q3, and Q7 are turned off, the transistor Q4 is turned on, the transistors Q8 and Q10 are turned on, the transistors Q9 and Q11 are turned off, and the output OUT ($\phi_2$) as shown in FIG. 2A is maintained at a high level H. In FIG. 2A, the relationships among the clock pulses $\phi_1$ and $\phi_R$, the potentials at nodes $N_2$ and $N_3$, and the output $\phi_2$ are illustrated. As is shown in FIG. 2A, the potential level at the node $N_2$ is placed at a level higher than the electric source voltage Vcc so that the output level of the output $\phi_2$ is obtained. In the circuit shown in FIG. 1, turning on the transistors Q8 and Q10 is accomplished by inputting the clock pulse $\phi_1$ to the gates of these transistor through the transistor Q6, and turning on the transistor Q6 is accomplished by the charge given to the gate of this transistor through the transistor Q5. However, since this charge is discharged through the transistor Q5 when the transistor Q4 is turned on, the transistor Q6 is presently turned off. Accordingly, turning on of the transistors Q8 and Q10 is only maintained by the charge stored in the capacitor C1, and when this charge is dissipated by a function leak or transistor leak, the transistors Q8 and Q10 are turned off.

The clock pulse $\phi_3$ is generated for activating the charge-pumping circuit including transistors Q12 and Q13 and the capacitor C2. More specifically, when the clock pulse $\phi_3$ is at a low level L, the capacitor C2 is charged through Vcc and Q13, and when the clock pulse $\phi_3$ is at a high level H, the charge of the capacitor C2 charges the output OUT through the transistor Q12. The frequency of the clock pulse $\phi_3$ is high, and, therefore, the above-mentioned pumping operation is repeated at a high speed. When the clock pulse $\phi_R$ is input to the circuit, as was pointed out hereinbefore, the transistor Q11 is turned on, and, hence, the level of the output OUT is reduced to a low level L.

Figure 2B:
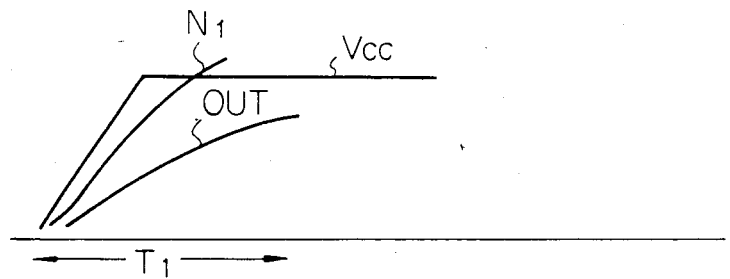
Figure 3:
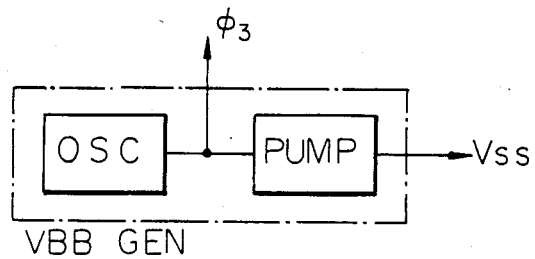
FIG. 3 is a circuit generating a clock pulse input to the charge-pumping circuit shown in FIG. 1.
Figure 4:
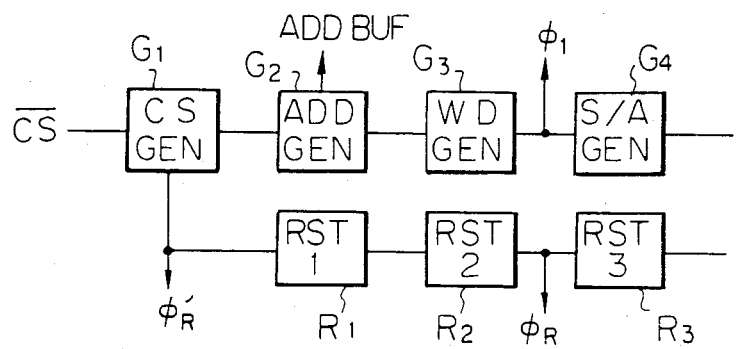
FIG. 4 is a circuit for generating various clock pulses input to the buffer shown in FIG. 1.

In a stationary state when the power source voltage Vcc is in the normal state, operation is carried out in the above-mentioned manner. However, just after application of the power source voltage, operation of the device is as follows. Namely, the clock pulse $\phi_3$ is output from a substrate bias-voltage generating circuit $V_{BB}$GEN. As is shown in FIG. 3, the circuit $V_{BB}$GEN comprises an oscillator OSC and a pumping circuit PUMP. Substantially simultaneously with application of the power source voltage Vcc, the circuit $V_{BB}$GEN starts operating, and hence, the clock pulse $\phi_3$ is simultaneously produced. In contrast, the clock pulses $\phi_1$ and $\phi_R$ are output from predetermined stages of various clock generators G1, G2, . . . and R1, R2, . . . connected in multiple stages, as shown in FIG. 4. Accordingly, predetermined logic levels of the clock pulses $\phi_1$ and $\phi_R$, are not attained at the time of application of the power source voltage. Incidentally, in FIG. 4, $\overline{CS}$ represents a chip-select bar signal, ADD BUF represents an address buffer, WD represents a word decoder, S/A represents a sense amplifier, and RST represents a reset circuit. When both the clock pulse $\phi_1$ and $\phi_R$ are at a low level L, the transistors Q10 and Q11 are kept in the "off" state and the output OUT is in the floating state. If the clock pulse $\phi_3$ is generated simultaneously with the rising of Vcc, the transistor Q13 is turned on, though insufficiently, and the capacitor C2 is charged by Vcc when the clock pulse $\phi_3$ is at a low level and in turn charges the output OUT through the transistors Q12 when the clock pulse $\phi_3$ is at a high level H. The capacitor C2 repeats this operation, and the voltage at the node N1 rises as indicated in the portion T1 of FIG. 2B. Also, the voltage of the output OUT is caused to rise. If the output OUT, that is, the clock pulse $\phi_2$, rises in this manner, operation of the buffer, activated upon receipt of the clock pulse $\phi_2$, is still insufficient, and other clock pulses to be supplied are not yet supplied. Accordingly, it sometimes happens that an abnormal current flows. For example, when the first and second transistors for receiving the clock pulse $\phi_2$ and other clock pulses are connected in series between the terminals of the power source, short circuiting of the power source is prevented since one of the transistors is turned off by supplying the other clock pulse to the other transistor when the clock signal is supplied to one transistor. If the clock pulse $\phi_2$ is supplied before the other clock pulses are supplied, both the first and second transistors are turned on and short circuiting of the power source occurs.

Figures 5A, 5B:
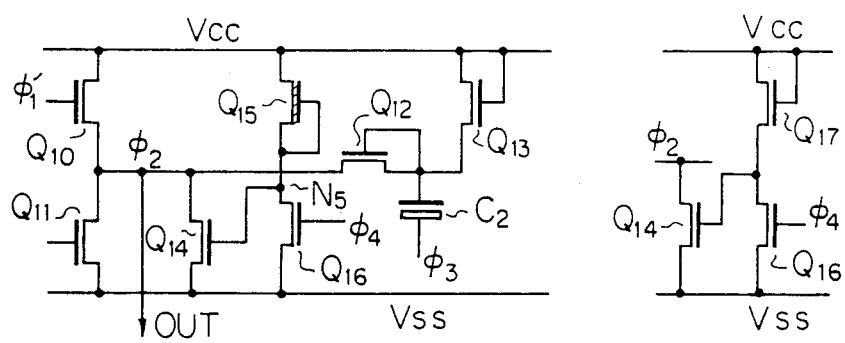
FIGS. 5A and 5B are circuit diagrams of one embodiment according to the present invention.
Figure 6:
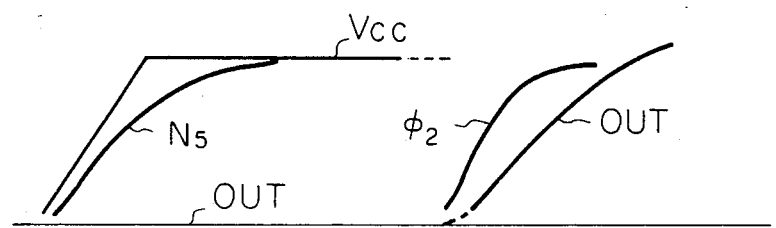
FIG. 6 is a timing chart of the operation of the circuits shown in FIG. 5.

FIG. 5A is an embodiment of the present invention. In FIG. 5A, Q10 and Q11 represent output stage transistors of the buffer or clock generator shown in FIG. 1, OUT represents the output of the buffer or clock generator, and Q12, Q13, and C2 form a charge-pumping circuit for the output OUT. In the present invention, a MOS transistor is disposed to pull down the output terminal voltage to the low voltage side Vss of the power source. The transistor Q15 and Q16 are MOS transistors for controlling the gate voltage of the transistor Q14. The transistor Q15 is a depletion-type transistor, but an enhancement-type transistor as shown in FIG. 5B may be used. However, in this case, the gate of the transistor is connected to the high voltage side. The transistor Q16 is an enhancement-type transistor, and a clock pulse $\phi_4$ is received by the gate of this transistor. Any clock pulse may be used as the clock pulse $\phi_4$ if it is of the same phase as that of the clock pulse $\phi_2$. For example, a clock pulse $\phi_1'$ supplied to the transistor Q10 or the output clock pulse $\phi_2$ may be used. In the case of $\phi_4 = \phi_1'$, even if the power source voltage is applied and operation of the pumping circuit formed by Q12, Q13, and C2 is started, the clock pulse $\phi_4$ is not supplied at this point, that is, the clock pulse $\phi_4$ is at a low level, and the transistor Q16 is turned off and the node N5 is pulled up by the transistor Q15, which is normally turned on, with the result that the node N5 rises together with Vcc as shown in FIG. 6. Accordingly, the transistor Q14 is turned on and the output terminal voltage OUT is pulled down to the low voltage side Vss of the power source. Therefore, the output OUT is maintained at a low level L. When the clock pulse $\phi_1'$ is supplied, the transistors Q10 and Q16 are turned on and the transistors Q11 and Q14 are turned off. At this point, the output terminal voltage OUT is no longer pulled down by the transistor Q14. Instead, the output terminal voltage OUT is pulled up by the transistor Q10 and the output OUT is caused to rise, whereby generation of the output before the supply of the clock pulse, which results in erroneous operation in the subsequent circuit, can be prevented.

In the case where the output clock pulse $\phi_2$ is used as the clock pulse $\phi_4$, the mutual conductance of the transistor Q14 is made smaller than that of the transistor Q10. Namely, the resistance of Q14 is made higher than that of Q10. Even if the resistance of Q14 is high, the rising of the output OUT due to incomplete pumping at the time of the rising of the power source voltage Vcc can be controlled sufficiently. When the clock pulse $\phi_1'$ is then supplied to turn on the transistor Q10 and turn off the transistor Q11, the output terminal voltage OUT is pulled up to the power source voltage Vcc by the transistor Q10 and the output voltage OUT rises. Accordingly, the transistor Q16 is turned on and the transistor Q14 is turned off, and the output terminal voltage is no longer pulled down. In short, a type of positive feedback is applied to the output OUT.

Figure 7:
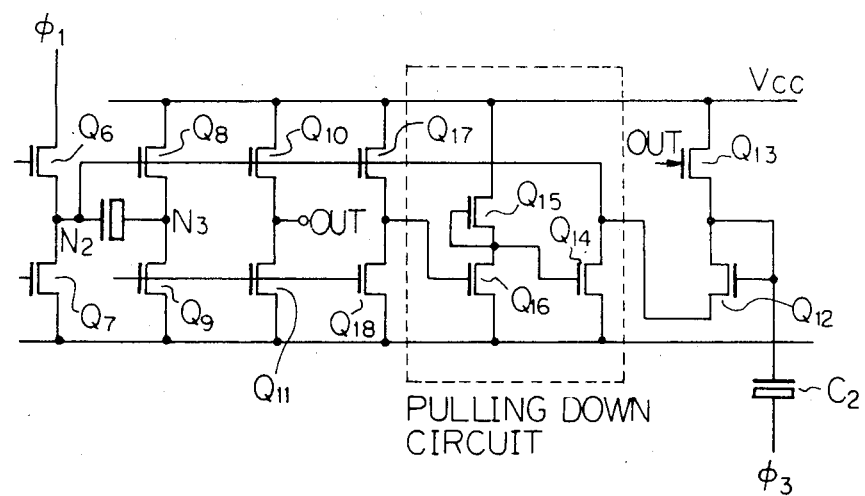
FIG. 7 is a circuit diagram of another embodiment according to the present invention.

FIG. 7 is a circuit diagram of another embodiment of the present invention. In FIG. 7, the same elements as those in FIGS. 5A and 5B are represented by the same symbols as those in FIGS. 5A and 5B. In FIG. 7, the circuit for pulling down the output terminal voltage is indirectly connected to the output of the buffer circuit. That is, the gate of the transistor Q16 is connected via transistors Q17 and Q18 to the output of the buffer circuit, and the connecting point between the drain of the transistor Q14 and the source of the transistor Q12 is connected to the node N2. In FIG. 7, the node N2 to be pumped is pulled down so that the same effect as that produced by the circuit shown in FIG. 5A can be obtained.

As is apparent from the foregoing illustrations, in the present invention, since the output terminal voltage of the buffer to be pumped is pulled down before the start of normal operation, the generation of an abnormal output at the time of application of the power source voltage is prevented and erroneous operation in a subsequent circuit can be avoided.

We claim:

1. A semiconductor device operatively connectable to receive a power source voltage, including a buffer, a reference level power line, and an output terminal providing an output terminal voltage, comprising:

a first transistor, operatively connected to the buffer, the power source voltage and the output terminal, for pulling up the output terminal voltage;

a second transistor, operatively connected to the buffer, said first transistor, and the reference level power line, for pulling down the output terminal voltage;

a charge-pumping circuit, operatively connected to the output terminal, for maintaining the output terminal voltage at a level higher than the power source voltage by charge-pumping when the output terminal voltage is at a high level and providing an output; and a circuit, operatively connected between the reference level power line and the power source voltage, and operatively connected to the output terminal, for pulling down the output terminal voltage during a period from the supply of power until an input signal is supplied to the buffer.

2. A semiconductor device according to claim 1, wherein said first transistor has a gate, has a source operatively connected to the power source voltage, and has a drain operatively connected to said second transistor, and wherein said circuit for pulling down the output terminal voltage is connected to the gate of said first transistor at a node.

3. A semiconductor device according to claim 1 or 2, and operatively connectable to receive a clock pulse, wherein said circuit for pulling down the output terminal voltage comprises:

a pulling down MOS transistor having a gate, having a drain operatively connected between the output of said charging-pumping circuit, and having a source operatively connected to the reference level power line;

a depletion-type MOS transistor having a source operatively connected to the power source voltage, having a drain, and having a gate operatively connected to the drain and operatively connected to the gate of said pulling down MOS transistor; and an enhancement-type MOS transistor having a source operatively connected to the gate of said depletion-type MOS transistor, having a drain operatively connected to the reference level power line, and having a gate operatively connected to receive the clock pulse, the clock pulse having the same phase as that of said output terminal voltage.

4. A semiconductor device according to claim 1 or 2, operatively connected to receive a clock pulse, wherein said circuit for pulling down the output terminal voltage comprises:

a pulling down MOS transistor having a drain operatively connected to the output of said charge-pumping circuit, having a source operatively connected to the reference level power line, and having a gate;

a first enhancement-type MOS transistor having a source and a gate operatively connected to said power source voltage, and having a drain operatively connected to the gate of said pulling down MOS transistor; and a second enhancement-type MOS transistor having a source operatively connected to the drain of said first enhancement-type MOS transistor, having a source operatively connected to the reference level power line, and having a gate operatively connected to receive the clock pulse which has the same phase as that of said output terminal voltage.

5. A semiconductor device, operatively connectable to a power source voltage and a reference voltage, including a buffer operatively connectable to receive an input signal, and an output terminal of the buffer terminal for providing an output voltage, said semiconductor device comprising:

a first transistor, operatively connected to the power source voltage and the output terminal, for pulling up the output voltage;

a second transistor, operatively connected to the reference voltage, said first transistor and the output terminal, for pulling down the output voltage;

a charge-pumping circuit, operatively connected to the output terminal, for maintaining the output voltage at a level higher than the power source voltage when the level at the output terminal is at a high level; and a pulling down circuit, operatively connected between the power source voltage and the reference voltage and operatively connected to the output terminal and said charge-pumping circuit, for pulling down the output voltage during a time period from when a power source voltage is supplied to the buffer until the input signal is supplied to the buffer.

6. A semiconductor device according to claim 5, wherein said pulling down circuit comprises:

a depletion-type transistor operatively connected to receive the power source voltage;

an enhancement-type transistor, operatively connected in series with said depletion-type transistor and operatively connected to the reference voltage; and a pull down transistor operatively connected to the output terminal and to said charge-pumping circuit.

* * * * *

UNITED STATES PATENT AND TRADEMARK OFFICE
CERTIFICATE OF CORRECTION

PATENT NO. : 4,570,088
DATED : FEBRUARY 11, 1986
INVENTOR(S) : SHIGEKI NOZAKI ET AL.

It is certified that error appears in the above-identified patent and that said Letters Patent is hereby corrected as shown below:

Col. 1, line 34, after "circuit" insert --,--;
 line 53, "a" should be --the--; and "the" should be --a--;
 line 56, delete "and".

Col. 2, line 11, after "a circuit" insert --for--;
 line 27, "metaloxide" should be --metal-oxide--;
 line 53, "transistor" (first occurrence) should be --transistors--;
 line 61, "function" should be --junction--.

Col. 3, line 65, "transistor" should be --transistors--.

Signed and Sealed this

Thirteenth Day of May 1986

[SEAL]

Attest:

Attesting Officer

DONALD J. QUIGG

Commissioner of Patents and Trademarks